United States Patent

Vendelin et al.

[15] 3,636,420

[45] Jan. 18, 1972

[54] LOW-CAPACITANCE PLANAR VARACTOR DIODE

[72] Inventors: George D. Vendelin, Richardson; Roger R. Webster, Dallas, both of Tex.

[73] Assignee: Texas Instruments Incorporated, Dallas, Tex.

[22] Filed: Feb. 2, 1970

[21] Appl. No.: 889,799

Related U.S. Application Data

[62] Division of Ser. No. 806,046, Mar. 7, 1969, abandoned.

[52] U.S. Cl. .......... 317/234, 317/235

[51] Int. Cl. .......... H01l 3/00

[58] Field of Search .......... 317/235, 234

[56] References Cited

UNITED STATES PATENTS 3,244,949 4/1966 Hilbiber .......... 317/235

3,271,201 9/1966 Pomerantz .......... 317/235 X 3,453,498 7/1969 Hubner .......... 317/101

*Primary Examiner*—James D. Kallam

*Attorney*—Kenneth R. Glaser, Samuel M. Mims, Jr., James O. Dixon, Andrew M. Hassell, Harold Levine, Jack A. Kanz, Gerald E. Epstein, Henry K. Woodward and Robert J. Crawford

[57] ABSTRACT

A planar varactor diode for integrated circuit applications, especially at high frequencies, is disclosed. This diode has low-leakage currents, improved reversed bias characteristics, and reduced junction and MOS capacitance. The low-leakage currents are obtained by minimizing the surface perimeter of the device; the low-junction capacitance is obtained by reducing the junction area of the two active regions; and the reduced MOS capacitance is achieved by offsetting the anodic region underneath the anode contact.

4 Claims, 15 Drawing Figures

INVENTOR
George D. Vendelin
Roger R. Webster
BY
ATTORNEY

LOW-CAPACITANCE PLANAR VARACTOR DIODE

This application is a division of application, Ser. No. 806,046, filed Mar. 7, 1969, now U.S. Letters Pat. No. 3,559,005, issued Jan. 26, 1971.

This invention relates to semiconductor fabrication processes and devices, and in particular to a planar varactor diode for integrated circuit applications having requirements of low leakage currents and improved reverse bias voltage characteristics.

Conventional microwave devices are not adaptable to monolithic integrated circuit structures and are further limited for use at high frequencies by package inductance and capacitance. Recent attempts to fabricate microwave diodes in integrated circuit structures so as to reduce stray capacitance losses have centered around the so-called surface-oriented concept. In a surface-oriented diode, the anode and cathode contacts emerge at the surface of the wafer and the diode junction is disposed essentially perpendicular to the surface of the wafer.

An important feature of the surface-oriented varactor structure is a low series resistance. This is achieved by diffusing the anode through an epitaxial layer into the underlying substrate, as illustrated in my copending application, Ser. No. 510,491, filed Nov. 23, 1965, for a surface-oriented varactor diode, now U.S. Pat. No. 3,396,317 issued Aug. 6, 1968. All of the effective diode capacitance is perpendicular to the surface and in series with the minimum resistance. The capacitance which would usually appear parallel to the surface is reduced in magnitude by diffusing the anode through the epitaxial layer and by using a high-resistivity substrate.

In many microwave applications it is of the utmost importance that the value of $Q$ for the diode be high. The value of $Q$ is expressed by the equation $$Q=(1/2\pi fRC)$$

Where $f$ is the frequency, $C$ the capacitance measured across the diode terminals, and $R$ the series resistance also measured across the diode terminals. The cutoff frequency of the diode occurs when $Q=1$. As a practical matter, a varactor diode must be operated at a low enough frequency to maintain a $Q$ greater than 10. It is evident that if a diode is to be operated at high frequencies the $RC$ product must be reduced to a very low value by the design of the diode. A semiconductor diode has an inherent capacitance across the PN- or PIN-junction (I indicating a high-resistivity region between the anode and cathode regions) which is determined generally by the width of the reverse bias depletion layer and the areas of the opposed boundaries of the depletion layer which may be considered as capacitor plates. Since the width of the depletion layer changes with changes in the magnitude of the reverse bias, the capacitance also changes with a change in the magnitude of the reverse bias. This feature is used to advantage in some reactive circuits such as harmonic generators where the diode is referred to as a varactor.

The conventional packaged diode also has stray and parasitic capacitance as a result of the packaging. For very high-frequency application (such as above KU-Band), the stray and parasitic capacitance is generally greater than the limit permissible. At lower frequencies (such as X-Band) the parasitics of properly designed packages are not excessive, but nevertheless restrict the possible freedom of use, and are thus undesirable.

One of the factors which influences leakage currents is the surface perimeter of the device. N-conductivity-type regions surfacing on a silicon device are believed to be a major cause of leakage currents. As is well known in the art, the maximum permissable reverse bias voltage (commonly referred to as breakdown voltage) is generally increased when leakage currents are reduced. The limit of improvement is reached when the breakdown of the device is all within the device, rather than at the surface. Reducing the perimeter and improving the surface condition both minimize the leakage current.

A limitation of the surface-oriented varactor structure is the existence of a shunting metal-oxide-semiconductor (MOS) capacitor due to the connecting lead patterns which causes unwanted losses at microwave frequencies and leakage current at low frequencies. The MOS capacitance loss is generally caused by a potential voltage drop between a metallic conductor separated from an active semiconductor region by an oxide layer. The MOS capacitance thus increases the leakage current and parasitic capacitance.

It is therefore an object of this invention to provide a semiconductor diode having a reduced surface perimeter.

Another object of the invention is to provide a monolithic semiconductor diode having a very low $RC$ product and therefore a high $Q$ and a high cutoff frequency.

Another object of the invention is to provide a device geometry wherein the parasitic MOS capacitance is minimized.

Still another object is to provide a diode wherein the junction capacitance tends to decrease nonlinearly at a greater rate with an increase in reverse bias.

A further object is to provide a diode wherein very small junction areas and low junction capacitance can be obtained.

A still further object is to provide a diode with low parasitic reactance suitable for use at X-Band and higher frequencies.

The novel features believed to be characteristic of this invention are set forth in the appended claims. The invention itself, however, as well as other objects and advantages thereof, may best be understood by reference to the following detailed description of illustrative embodiments, when read in conjunction with the accompanying drawings, wherein:

In brief, one embodiment of the invention comprises a semiconductor planar varactor diode in a silicon substrate with a P+-conductivity-type anode region separated from a N+-conductivity-type cathode contact region by an N-conductivity-type cathode region. The integrated planar varactor diode has low series resistance with the effective diode capacitance being parallel to the surface and in series with the minimum resistance due to the high-resistivity epitaxial layer. The diode capacitance which is perpendicular to the surface due to both the anode and cathode emerging on the same surface of the substrate is minimized by reducing the diode surface perimeter. A small hole formed through the metallic anode contact and silicon oxide layer allows the elimination of certain portions of the semiconductor regions beneath the anode contact, thereby forming a cavity thereunder which serves to minimize the MOS capacitor which is inherently parallel to the diode prior to the removal of the semiconductor material. In another embodiment of the invention, the MOS capacitor effect is minimized not by an air dielectric cavity, as in the first embodiment, but by offsetting the anode region underneath the anode contact such that the portions of the other active regions of the diode beneath the anode contact are kept to a minimum.

Figures 1, 2A, 2B, 2C:
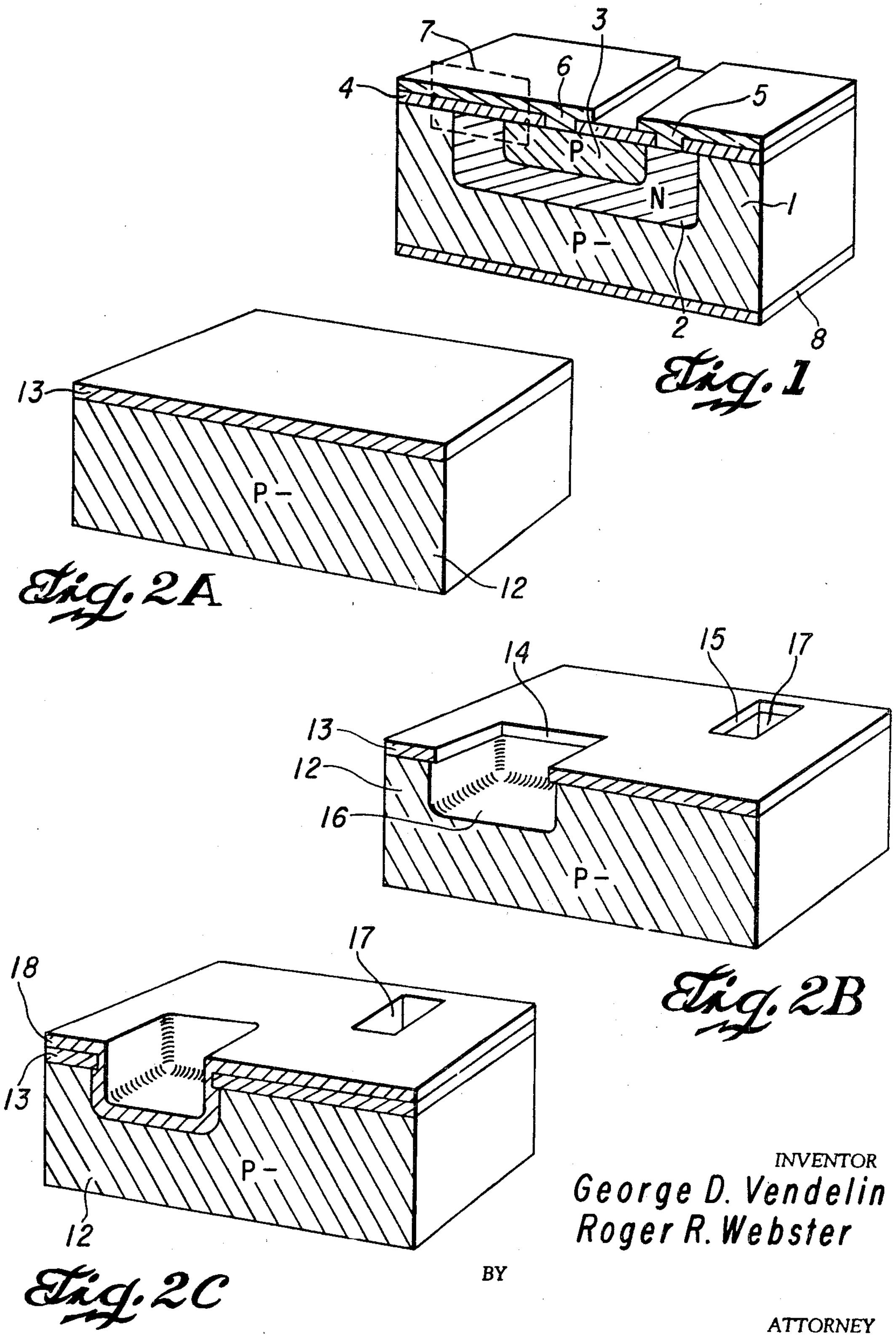
FIG. 1 is a pictorial view, partially in section, of a prior art diode.
FIG. 2A–2L illustrate in a succession of pictorial views, partially in section, the fabrication steps of one embodiment of the invention.

Referring now to the FIGS. of the drawing, FIG. 1 illustrates a conventional surface-oriented varactor diode. An N-conductivity-type region 2 which acts as the cathode of the diode is diffused or epitaxially deposited in the P-conductivity-type substrate 1. The anode region 3 of the device is formed by diffusing a P-conductivity-type impurity into the N-conductivity-type cathode region 2 to form a P-conductivity-type region. The surface of the device is protected by a silicon oxide layer 4 which has holes patterned therein to allow the anode contact 6 to the P-conductivity-type region 3 and the cathode contact 5 to the N-conductivity-type region 2. The metal ground plane 8 is formed on the substrate 1 opposite the cathode and anode contacts 5 and 6. One of the principal disadvantages of such a device for use in microwave applications is the metal-oxide-semiconductor (MOS) capacitor, which is indicated by the dotted line 7. The MOS capacitor is in parallel with the varactor diode and is comprised of the metal anode contact 6, the oxide layer 4 and the N-conductivity-type region 2. Such a MOS capacitor decreases the cutoff frequency of the varactor diode and is generally undesirable due to capacitance losses and increased leakage currents.

The construction of the planar varactor diode in accordance with one embodiment of the present invention can be best understood by describing the stages of its fabrication as illustrated in FIGS. 2A–2L.

The starting material for fabricating the diode is a very high resistivity substrate 12. For most applications the substrate 12 should have as high a resistivity as possible, a resistivity greater than 1,500 ohms/centimeter being possible although the resistivity may vary for different applications. The substrate may be either P-type of N-type and may be either silicon or other semiconductor materials. In the preferred embodiment here being illustrated, substrate 12 is P-conductivity-type silicon. The substrate 12 is placed in a suitable reactor furnace and heated to about 1,200° C. to grow a thermal oxide masking layer 13 to a thickness of about 1 micrometer as indicated in FIG. 2A.

The oxide layer 13 is then patterned by conventional photoresist and etching techniques to leave openings 14 and 15. Next, the substrate 12 is subjected to an etchant for a period of time sufficient to etch cavities 16 and 17 in the areas exposed by the openings 14 and 15, as illustrated in FIG. 2B. Cavities 16 and 17 are made relatively deep, the depth being in the order of 40 micrometers.

A second oxide 18 is then grown over the face of the wafer 12 as shown in FIG. 2C, using the thermal method previously described.

Figures 2D, 2E, 2F, 2G:
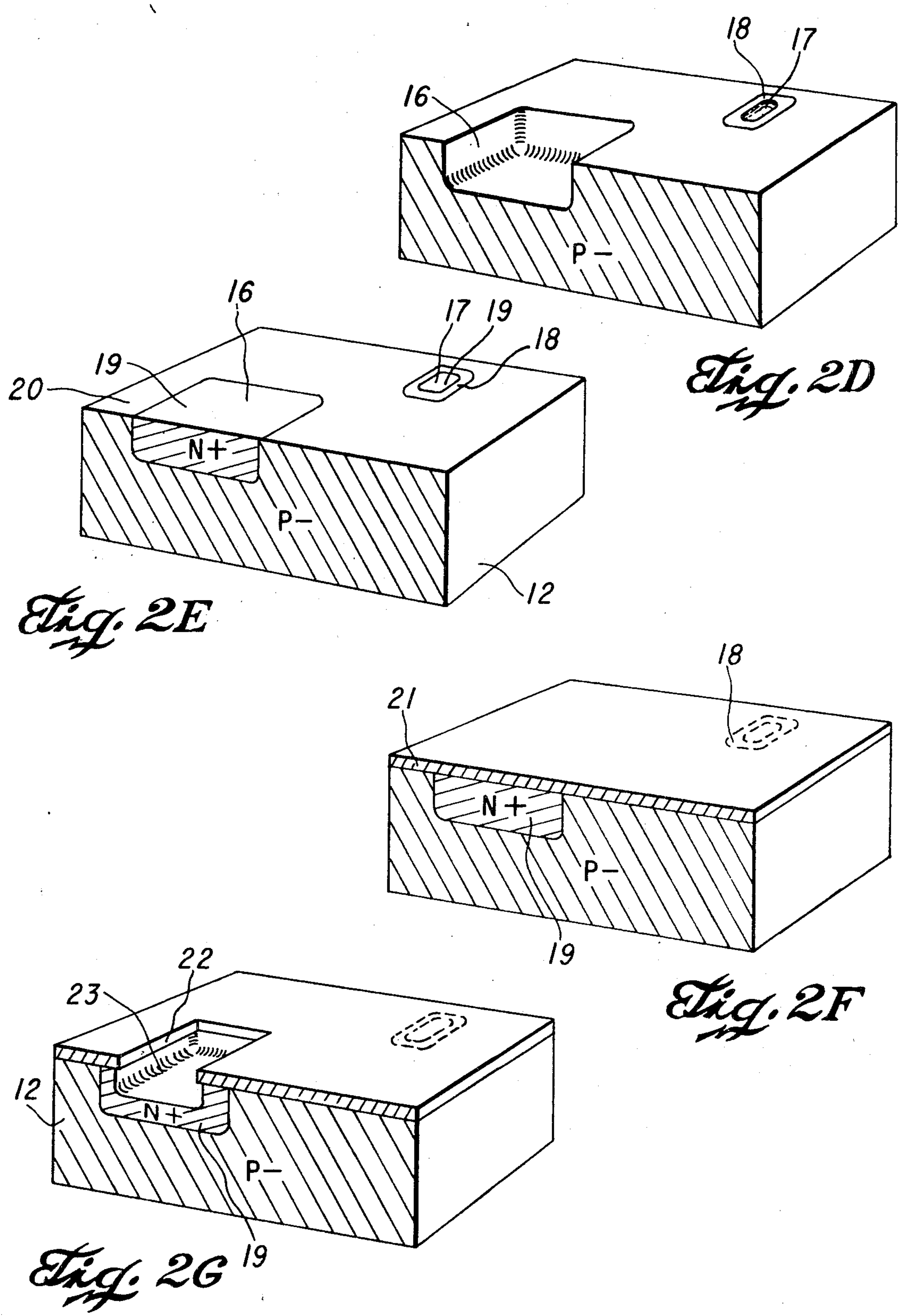

By using conventional photoresist and etching techniques substantially all of the silicon oxide 13 and 18 is removed, leaving only the portion of the oxide 18 which is in the cavity 17, as illustrated in FIG. 2D. The oxide 18 that is left in cavity 17 will be used as a convenient lapping stop to determine the necessary amount of lapping in subsequent steps of the process.

The substrate 12 is then placed in a conventional reactor furnace and a 0.01 ohm/cm. N+–conductivity-type epitaxial deposit containing arsenic as the impurity material, for example, is built up over the face of substrate 12 until both cavities 16 and 17 are completely filled with the epitaxial material 19.

The substrate 12 is then mechanically lapped and polished to the original surface 20 of the substrate 12 to remove all the excess deposited material, as shown in FIG. 2E. The portion of the silicon oxide layer 18 in the epitaxially filled cavity 17 acts as a convenient stop or indicator of sufficient polishing. As the excess deposited material is removed by lapping and polishing, the edge of the oxide 18 that reaches the surface 20 of the substrate 12 will come into view. Since the oxide is of a different color than the silicon substrate 12, the correct amount of lapping is easily ascertainable visually. The oxide layer 18 also serves as an alignment pattern for subsequent masking operations. Although the lapping stop facilitates the diode fabrication, it can be eliminated where other means of lapping control or alignment are used. An oxide layer 21 is then thermally grown on the surface of the substrate 12 to a thickness of approximately 1 micrometer, bringing the structure to the stage shown in FIG. 2F. Since the oxide layer 21 grows at a slower rate from the oxide 18 than from the remainder of the surface of the substrate 12, the oxide layer 21 above the oxide lapping stop 18 will be thinner than the remainder of the oxide 21. Because of the difference in color between the oxide over the lapping stop the rest of the oxide, the lapping stop is used as alignment aid throughout the remainder of the process. The thin oxide is indicated by the dotted lines defining the area of the oxide 18 beneath subsequent oxide layers.

The oxide layer 21 is patterned by conventional photoresist and etching techniques to leave an opening 22. Next, the substrate 12 is placed in a reactor and subjected to an etching condition for a period of time sufficient to etch a cavity 23 in the portion of the N+–conductivity-type region 19 which is exposed by the opening 22, as shown in FIG. 2G. The cavity is very shallow and must be closely controlled, the depth being on the order of 5 micrometers.

Figures 2H, 2I, 2J, 2K:
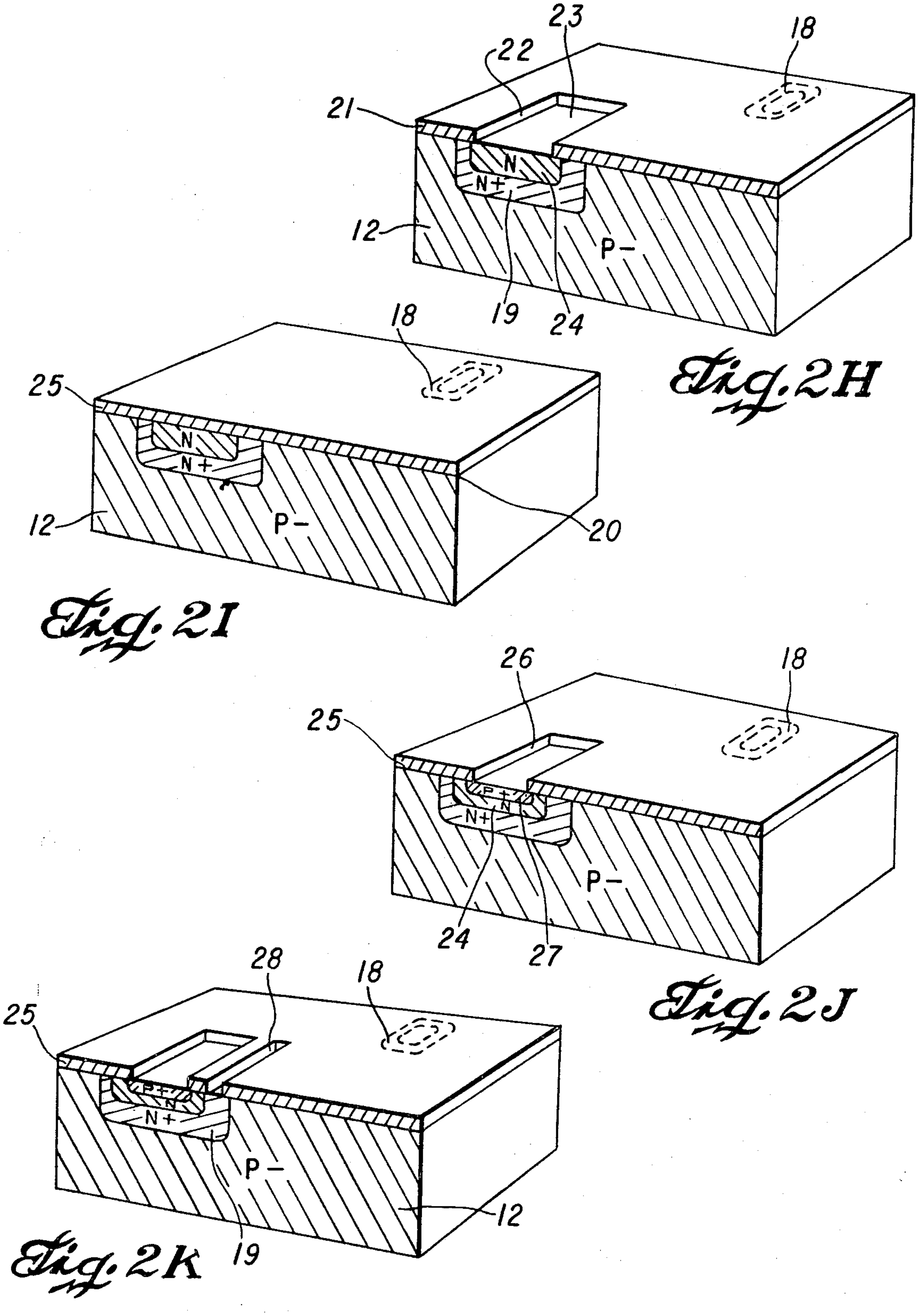

The next step in the process is to selectively refill cavity 23 with N-conductivity-type semiconductor material 24 by epitaxial deposition as shown in FIG. 2H. The material is doped with a suitable N-conductivity-type doping impurity, such as arsenic, to provide as low a resistance as possible and still provide the desired breakdown voltage. For example, silicon doped with arsenic to make 0.44 ohm/cm. resistivity material will provide about a 50-volt breakdown voltage when the thickness of the N-type conductivity region is approximately 2.5 micrometers.

The epitaxial material 24 is deposited selectively only in the area exposed by the opening 22 in the oxide layer 21, as compared to the epitaxial material 19 that was previously deposited over the entire face 20 of the substrate 12.

Following the epitaxial deposition of N-conductivity-type material in cavity 23 to form region 24 as shown in FIG. 2H, the substrate 12 is partially lapped to remove any silicon overgrowth on the silicon oxide as a result of the epitaxial deposition of the N-type material 24. The oxide 21 (FIG. 2H) is then completely removed by an etching process utilizing, for example, a chemical etch such as dilute hydrofluoric acid. The oxide layer 25 is thereafter thermally grown by the process previously described to completely cover the face 20 of the substrate 12, as illustrated in FIG. 2I.

The oxide layer 25 is patterned by suitable photoresist and etch techniques to form the opening 26 over the N-conductivity-type material 24, as shown in FIG. 2J. By conventional diffusion techniques the P+–conductivity-type anode region 27 is then formed to a depth of approximately 2.5 microns. The oxide layer 25 is further patterned by conventional photoresist and etch techniques to form the contact window 28 to the cathode region 19 of N+–conductivity-type, as seen in FIG. 2K.

Figures 2L, 3:
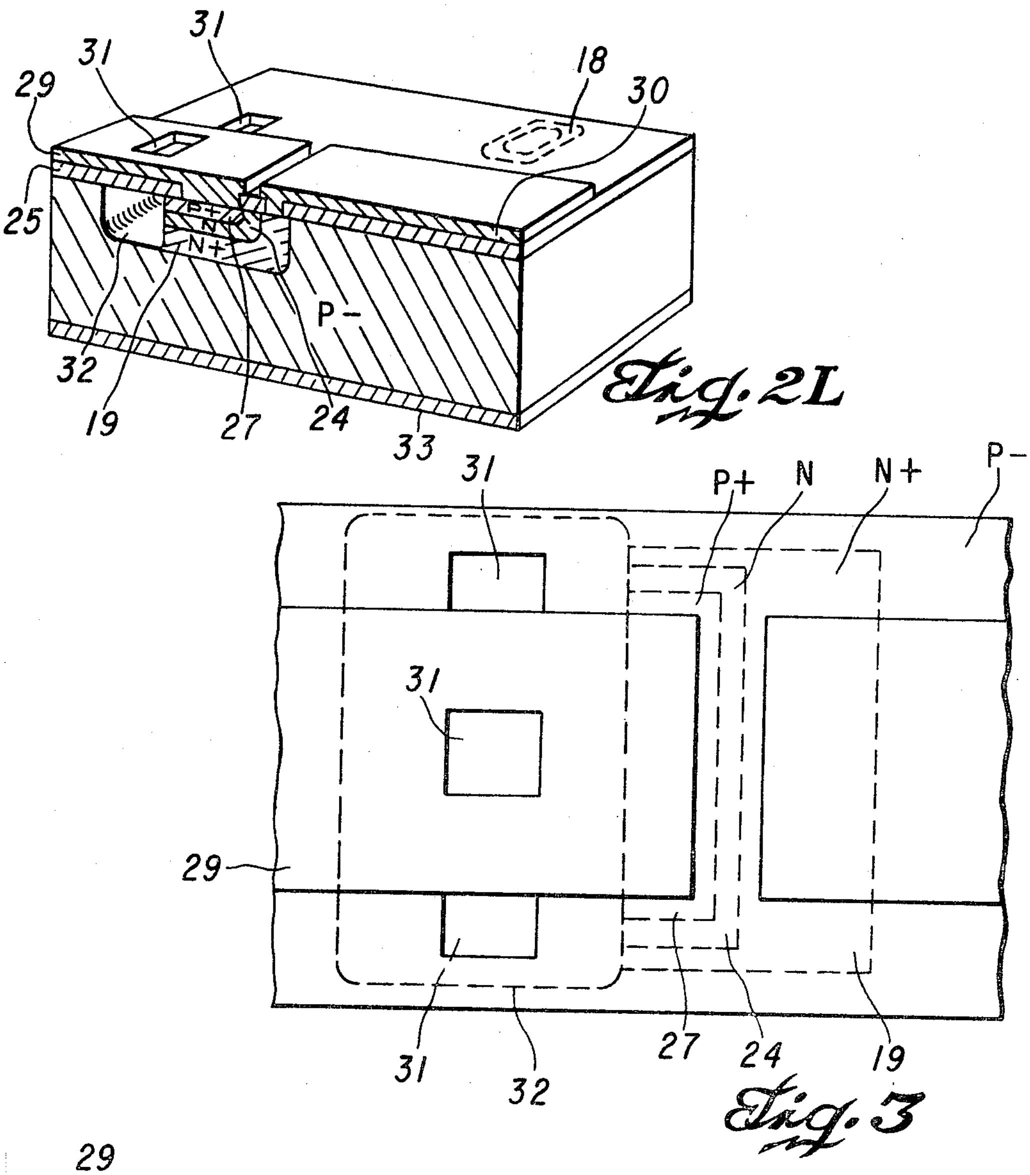
FIG. 3 is a plan view of the diode in FIG. 2L.

After the substrate 12 has reached the stage indicated by FIG. 2K, it is placed in a vacuum evaporator (not shown) and the top surface thereof completely covered with a metal such as aluminum. Again by the use of suitable photoresist and etch techniques the metal is selectively removed to form the anode contact 29 and the cathode contact 30 as shown in FIG. 2L. In addition, three windows 31 (one window not being shown), one in the anode contact 29 and one on either side of the anode contact window are formed by conventional photoresist and etch techniques for the purpose of exposing the underlying semiconductor material for a subsequent etch. Again by the use of conventional photoresist and etch techniques, the cavity 32 is formed beneath the anode contact 29, as illustrated in FIG. 2L. It will be noted that the cavity 32 is of such depth and width that only a very small portion of the N-conductivity-type region 24 and N+–conductivity-type region 19 remain beneath the silicon oxide layer 25 that lies under the anode contact 29. In addition, the portion of the N-conductivity-type region 24 that previously surfaced beneath the silicon oxide 25 is reduced by the formation of the cavity 32, thereby reducing the surface leakage of the diode. The final fabrication step before evaporation is the deposition of the metallic ground plane 33 by conventional means.

In FIG. 3 there is shown a top view of a finished planar varactor diode (the remainder of the integrated circuit not being shown). The area within the dashed lines are there indicated by the identical designation in FIG. 2L. Most of the N-conductivity-type region 24 and the N+–conductivity-type region 19 beneath the metallic anode contact 29 has been removed, thereby minimizing the MOS capacitance loss.

Figure 4:
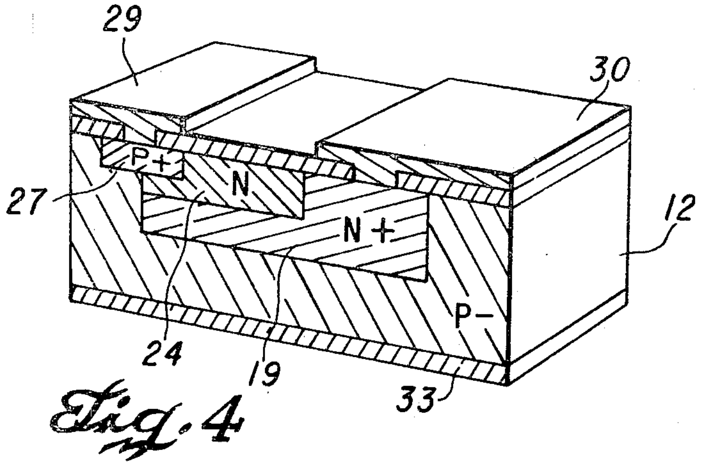
FIG. 4 is a pictorial view, partially in section, of another embodiment of the invention.

In FIG. 4 there is shown another embodiment of the invention where instead of using a cavity beneath the metallic anode contact 29, the P+–conductivity-type anode region 27 is offset from the N-conductivity-type region 24 and N+–conductivity-type cathode contact region 19. The metallic layer 33 forms the ground plane of the device. By this technique, the amount of N-conductivity-type material beneath the metal anode contact 29 is also kept to a minimum, thus limiting the MOS capacitance loss.

Although the invention was described using a P-conductivity-type substrate, it is obvious that a diode could be made using a N-substrate with all the regions being of opposite conductivity type from those illustrated.

Although the preferred embodiments of the invention have been described in detail, it is to be understood that various changes, substitutions, and alterations can be made without departing from the spirit and scope of the invention. In addition, the dimensions of the different elements of the planar varactor diode as described are by way of illustration only and do not limit the invention in any way.

What is claimed is:

1. A semiconductor device comprising in combination:

a. a high-resistivity semiconductor substrate of one conductivity type;

b. a low-resistivity first region of opposite conductivity type extending into said substrate from one surface of said substrate;

c. a high-resistivity second region of said opposite conductivity type extending from said one surface at least partially into said first region and offset from the center of said first region;

d. a low-resistivity third region extending into said second region from said one surface of said substrate and offset from the center of said second region to produce a PN-junction;

e. an insulating layer upon said one surface of said substrate;

f. a first metal contact overlying a portion of said insulating layer and extending through a first opening in said insulating layer over said second region;

g. a second metal contact overlying a portion of said insulating layer and extending through a second opening in said insulating layer into contact with said first region, the portion of said insulating layer that is contiguous to said second metal contact being substantially positioned over said third region and said substrate, thereby substantially eliminating MOS capacity from said device and reducing the surface perimeter and shunting capacity of said device.

2. A semiconductor device as set forth in claim 1 wherein said substrate has a resistivity greater than 1,500 ohm/centimeter.

3. The semiconductor device of claim 1 wherein said device is a diode and wherein:

a. said one conductivity type is P-type and said opposite conductivity type is N-type; and wherein b. said first region is the cathode contact region of said diode and said first metal contact is the cathode contact of said diode; and wherein c. said third region is the anode contact region of said diode and said second metal contact is the anode contact of said diode; and wherein d. said second region is the cathode region of said diode which separates said cathode contact region from said anode contact region.

4. The semiconductor device of claim 1 wherein the relative position of said third region with respect to said first and second regions reduces the surface perimeter of said device thereby reducing leakage currents in said device.

* * * * *